United States Patent
Maheshwari et al.

(10) Patent No.: US 11,209,481 B2
(45) Date of Patent: Dec. 28, 2021

(54) MULTIPLE INPUT SIGNATURE REGISTER ANALYSIS FOR DIGITAL CIRCUITRY

(71) Applicant: TEXAS INSTRUMENTS INCORPORATED, Dallas, TX (US)

(72) Inventors: Naman Maheshwari, Ghaziabad (IN); Wilson Pradeep, Bangalore (IN); Prakash Narayanan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/217,289

(22) Filed: Dec. 12, 2018

(65) Prior Publication Data

US 2019/0113566 A1  Apr. 18, 2019

Related U.S. Application Data

(63) Continuation of application No. 15/395,307, filed on Dec. 30, 2016, now Pat. No. 10,184,980.

(30) Foreign Application Priority Data

Sep. 6, 2016 (IN) .............................. 201641030316

(51) Int. Cl.
*G01R 31/317* (2006.01)
*G01R 31/3185* (2006.01)
*G01R 31/3193* (2006.01)
*G01R 31/3177* (2006.01)

(52) U.S. Cl.
CPC ... *G01R 31/31703* (2013.01); *G01R 31/3177* (2013.01); *G01R 31/31723* (2013.01); *G01R 31/31725* (2013.01); *G01R 31/31937* (2013.01); *G01R 31/318547* (2013.01); *G01R 31/318566* (2013.01)

(58) Field of Classification Search
CPC .................... G01R 31/31703; G01R 31/31723
See application file for complete search history.

(56) References Cited

U.S. PATENT DOCUMENTS 4,313,200 A * 1/1982 Nishiura .......... G01R 31/31921
                                                   714/736
4,503,537 A    3/1985 McAnney
5,042,034 A * 8/1991 Correale, Jr. .. G01R 31/318572
                                                   714/727

(Continued)

*Primary Examiner* — Joseph D Torres
(74) *Attorney, Agent, or Firm* — Ebby Abraham; Charles A. Brill; Frank D. Cimino

(57) ABSTRACT

A system includes a multiple input signature register (MISR) to receive outputs from M different scan chains in response to N test patterns applied to test an integrated circuit. The MISR provides N test signatures for the integrated circuit based on the outputs of the M different scan chains generated in response to each of the N test patterns. Each of the scan chains holds one or more test data bits that represent behavior of the integrated circuit in response to each of the N test patterns. A shift register is loaded from an interface and holds one of N comparison signatures that is used to validate a respective one of the N test signatures generated according to a given one of the N test patterns. A comparator compares each of the N test signatures with a respective one of the N comparison signatures to determine a failure condition based on the comparison.

7 Claims, 7 Drawing Sheets

(56) References Cited

U.S. PATENT DOCUMENTS

| | | | |
|---|---|---|---|
| 5,369,648 A | 11/1994 | Nelson | |
| 5,444,716 A | 8/1995 | Jarwala et al. | |
| 5,506,959 A * | 4/1996 | Cockburn | G11C 29/10 |
| | | | 365/201 |
| 5,570,375 A | 10/1996 | Tsai et al. | |
| 5,745,500 A | 4/1998 | Damarla et al. | |
| 5,930,270 A * | 7/1999 | Forlenza | G01R 31/3177 |
| | | | 714/732 |
| 5,991,909 A | 11/1999 | Rajski et al. | |
| 6,393,594 B1 * | 5/2002 | Anderson | G01R 31/3183 |
| | | | 714/724 |
| 6,615,379 B1 * | 9/2003 | Tripp | G01R 31/318502 |
| | | | 324/762.01 |
| 6,671,839 B1 | 12/2003 | Cole et al. | |
| 6,684,358 B1 | 1/2004 | Rajski et al. | |
| 7,032,148 B2 | 4/2006 | Wang et al. | |
| 7,493,540 B1 | 2/2009 | Rajski et al. | |
| 7,552,373 B2 | 6/2009 | Wang et al. | |
| 7,607,059 B2 | 10/2009 | Osanai | |
| 7,856,582 B2 | 12/2010 | Cervantes et al. | |
| 7,921,346 B2 | 4/2011 | Forlenza et al. | |
| 8,412,993 B2 | 4/2013 | Song et al. | |
| 8,448,032 B2 | 5/2013 | Sharma et al. | |
| 8,533,547 B2 | 9/2013 | Rajski et al. | |
| 8,843,797 B2 | 9/2014 | Motika et al. | |
| 9,297,856 B2 | 3/2016 | Douskey et al. | |
| 9,588,177 B1 * | 3/2017 | Atwood | G01R 31/31707 |
| 2004/0006729 A1 * | 1/2004 | Pendurkar | G01R 31/318561 |
| | | | 714/733 |
| 2004/0246337 A1 | 12/2004 | Hasegawa et al. | |
| 2005/0055617 A1 | 3/2005 | Wang et al. | |
| 2005/0268194 A1 | 12/2005 | Wang et al. | |
| 2006/0064614 A1 | 3/2006 | Abdel-Hafez et al. | |
| 2007/0050693 A1 * | 3/2007 | Kiryu | G01R 31/318566 |
| | | | 714/733 |
| 2007/0234157 A1 * | 10/2007 | Rajski | G01R 31/318563 |
| | | | 714/728 |
| 2009/0210761 A1 * | 8/2009 | Forlenza | G01R 31/318544 |
| | | | 714/729 |

* cited by examiner

MULTIPLE INPUT SIGNATURE REGISTER ANALYSIS FOR DIGITAL CIRCUITRY

CROSS-REFERENCE TO RELATED APPLICATION

This application is a continuation of U.S. patent application Ser. No. 15/395,307, filed Dec. 30, 2016, which claims the benefit of priority from India Provisional Patent Application 201641030316, filed on Sep. 6, 2016, and entitled NOVEL METHOD AND APPARATUS FOR PER CYCLE AND PER PATTERN MISR DEBUG AND DIAGNOSIS, the entirety of both are incorporated by reference herein.

TECHNICAL FIELD

This disclosure relates to integrated circuit testing and more particularly to systems and methods that facilitate analysis of digital circuitry using multiple input signature register (MISR) architectures.

BACKGROUND

The test time that scan tests require typically dominates manufacturing-test costs for integrated circuit designs. The increase in design complexity and the requirements for delay tests have made test time a design parameter that requires active management in nanometer integrated circuit designs. As the number of test patterns increases, ft takes more tester-buffer space to hold the complete test set, and it takes longer to execute the test set in manufacturing. To address both the data-volume and test-time problems, test engineers and test architects have developed techniques employing on-chip hardware that compresses the test-stimulus and response patterns and then applies them to the chip under test.

As an example, The dominant method of testing digital circuits is the use of an automatic test-pattern generator (ATPG) to target a stuck-at or transition fault model at all of the circuit nodes in the integrated circuit. In circuits that contain storage elements, engineers can use scan registers to enable control and observation of the storage elements and ensure high fault coverage. When the ATPG generates too many test patterns, the test-application time becomes too long, and engineers must use on-chip-compression techniques to minimize test time and, thus, test costs.

One compression technique includes the use of multiple input signature registers (MISR) to compress test responses from the circuit under test. The output data from the integrated circuit continually clocks into the MISR, and, at the end of the test, the signature in the MISR assesses a pass or fail versus a known-good signature.

SUMMARY

This disclosure relates to a system and method that facilitates diagnosis and debugging of multiple input signature register (MISR) integrated circuit testing architectures.

In one example, a system includes a multiple input signature register (MISR) to receive outputs from M different scan chains in response to N test patterns applied to test an integrated circuit. The MISR provides N test signatures for the integrated circuit based on the outputs of the M different scan chains generated in response to each of the N test patterns. Each of the scan chains holds one or more test data bits that represent behavior of the integrated circuit in response to each of the N test patterns. A shift register is loaded from an interface and holds one of N comparison signatures that is used to validate a respective one of the N test signatures generated according to a given one of the N test patterns. A comparator compares each of the N test signatures with a respective one of the N comparison signatures to determine a failure condition based on the comparison.

In another example, a method includes generating a test signature in a multiple input signature register (MISR) from scan chains derived from a test pattern applied to test an integrated circuit. The method includes comparing the test signature from the MISR to a comparison signature each time a new signature is generated in the MISR to determine a difference between the signatures. The method includes storing the test pattern in a log file if the difference between the signatures is determined to facilitate further analysis of the integrated circuit.

In yet another example, a method includes loading scan chains derived from a test pattern applied to test an integrated circuit. The test pattern is retrieved from a log file that is at least a portion of a failed signature from a previous test of the integrated circuit. The method includes updating each cell of a multiple input signature register (MISR) by clocking at least one bit from each of the respective scan chains into each cell of the MISR. The method includes comparing the data from the MISR to comparison data from an expected signature memory to facilitate locating a circuit failure within the integrated circuit.

DETAILED DESCRIPTION

This disclosure relates to a system and method that facilitates diagnosis and debugging of multiple input signature register (MISR) integrated circuit testing architectures. A MISR system and method are provided where an additional shift register is operated in parallel with a MISR to enable in-situ and real time pattern comparison testing between the MISR register and the shift register. As output test patterns from testing scan chains are clocked into the MISR register to generate signatures during testing of the integrated circuit, the shift register can be loaded concurrently (e.g., via an internal memory or external interface) to MISR signature generation operations with comparison signature test patterns. As each new signature is generated in the MISR register, an external interface loads a new comparison signature into the shift register, which can then be compared to the MISR register via a comparator to determine if the respective generated signature has passed or failed based on the comparison. A log file can be created that records the test pattern that resulted in the failed signature. A subsequent debugging operation and method can then apply the failed test pattern to the integrated circuit, where each bit in the scan cycle that was utilized to generate the respective failed signature can be analyzed (e.g., per cycle testing) to determine where in the integrated circuit the failure occurred.

By performing in-test comparisons, the systems and methods described herein add minimal test time and design overhead to conventional MISR architectures. The systems and methods described herein can implement a two-phase diagnostic approach using the same MISR architecture, such as by implementing per pattern signature analysis followed by per cycle signature analysis (e.g., analyze intermediate bits used to generate a given signature). The per pattern phase helps identify the failing pattern(s) in a vector format such as a test description language (TDL) or standard test interface language (STIL), for example, and the per cycle phase helps identify the failing cycle(s) and the failing internal chain data. The combination of per pattern and per cycle analysis can be utilized to determine a location for failing digital circuitry (e.g., flip-flops). An objective of this analysis is to build a signature dictionary for per-pattern and per-cycle checkpoints. The analysis in each phase can be enabled using an extension script (e.g., PERL) in conjunction with an automatic test-pattern generator (ATPG) tool, for example.

Figure 1:
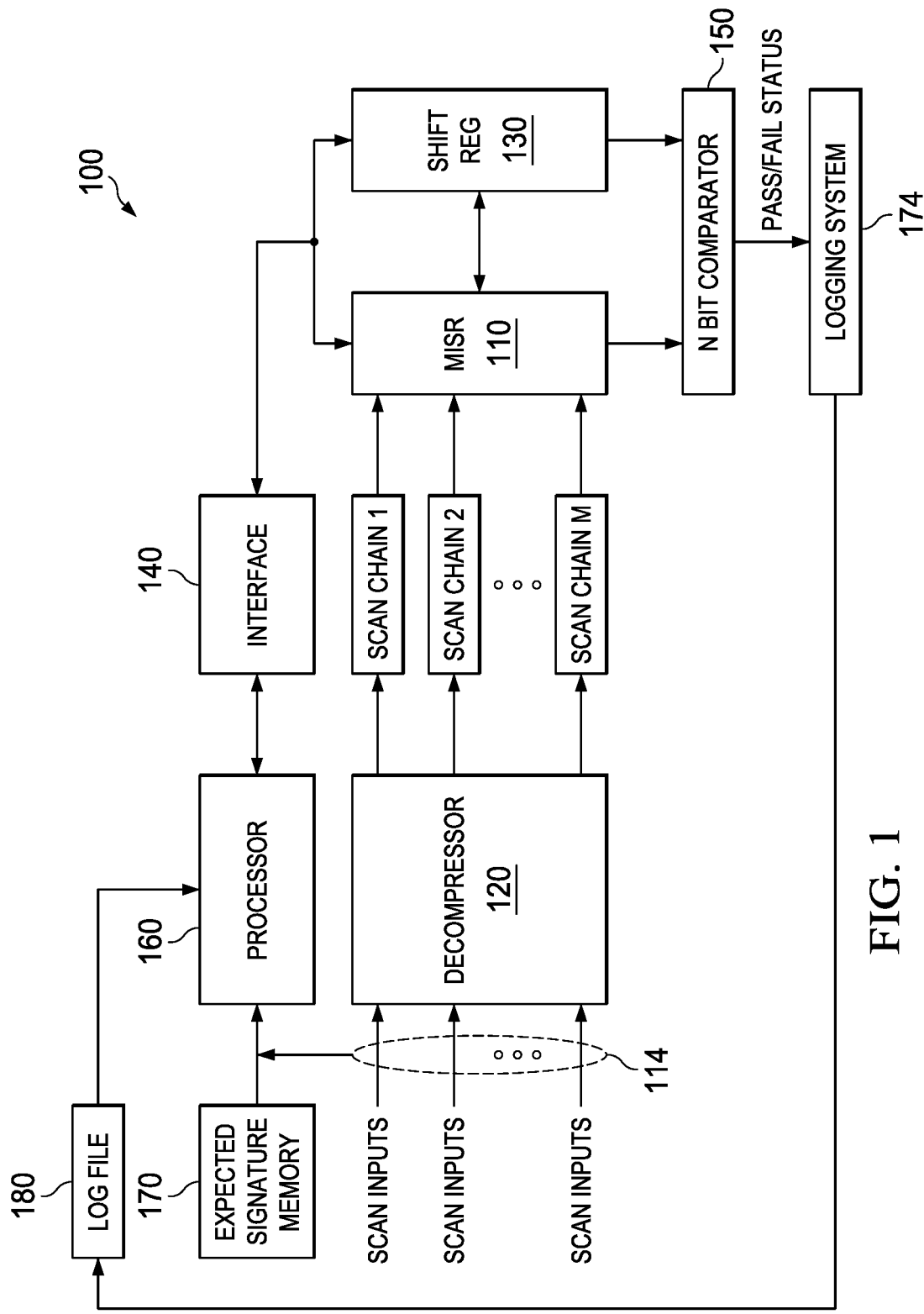
FIG. 1 illustrates an example schematic block diagram of a testing system that utilizes a multiple input signature register (MISR).

FIG. 1 illustrates an example of a testing system 100 that includes a multiple input signature register (MISR) 110. The MISR 110 is activated to compress M different scan chains, shown as scan chains 1 though M, from N different scan inputs 114 to which test patterns are applied, where M and N are positive integers. The MISR 110 provides N test signatures for an integrated circuit based on the M different scan chains. As used herein, the term circuit can include a collection of active and/or passive elements that perform a circuit function such as an analog circuit or control circuit, for example. Additionally or alternatively, the term circuit can include an integrated circuit where all and/or some of the circuit elements are fabricated on a common substrate, for example. Also as used herein, the term MISR signature refers to a data value stored in the MISR 110 after at least one bit from each of the scan chains has been clocked into the MISR. The MISR can include a circuit of flip-flops preceded by exclusive OR logic that is at the output of each scan chain. The MISR 110 generates a complete signature if all the contents from the scan chains 1-M derived from one test pattern applied to inputs 114 are clocked into the MISR. An intermediate signature is generated when only a portion of each scan chain is clocked into the MISR.

In the example of FIG. 1, the scan inputs 114 receive test patterns that are provided to a decompressor 120 which receives a smaller test pattern sequence from the scan inputs and expands the sequence to M testing patterns which can applied to test an integrated circuit (not shown). In one example describing the number of external scan channels "S" can be processed, where the decompressor 120 expands S bits to M bits for each cycle in a given test pattern applied to scan inputs 114. Each of the scan chains 1 though M holds one or more test data bits to test the integrated circuit. The data in the respective scan chains reflects output responses from the circuit under test as stimulated by the expanded test patterns generated by the decompressor 120. A shift register 130 can be loaded from an interface 140 and holds one of N comparison signatures that is used to validate one of the N test signatures in the MISR 110. The interface 140 can be implemented as a joint test action group (JTAG) interface or an IEEE 1500 interface. Other interfaces are possible including custom interfaces (serial or parallel). In an alternative example, the shift register 130 may not be provided. Instead, the contents of the MISR 110 can be shifted out directly via the interface 140 for comparison with the comparison signatures described herein.

A comparator 150 compares each of the N test signatures with a respective one of the N comparison signatures to determine a failure condition based on the comparison. The comparator 150 can determine the failure condition if the comparison (e.g., a bitwise comparison) indicates one or more bits of the test signature do not match one or more bits of the comparison signature.

A processor 160 operates the interface 140 to control loading/unloading of the shift register 130 and to control data exchanges between the MISR 110 and the shift register 130. The processor 160 can be a single processor or split into multiple processors for the processing operations described herein. In one example, the processor 160 retrieves the comparison signatures from an expected signature memory 170 (e.g., file or memory location) and loads the shift register 130 via the interface. In another example, the processor 160 can be provided as an on-chip controller to access the MISR 110 and/or shift register 130 via the interface 140. Another processor (not shown) can be provided to provide the test patterns via the scan inputs 114 and also manage various test routines for automatic pattern generation and testing. In some examples, the decompressor 120, scan chains, MISR 110, shift register 130 and comparator 150 can be provided on a common substrate as part of an integrated circuit. The processor 160 can be provided as an external or as an internal member of the common integrated circuit substrate, for example.

The expected signature memory 170 can include complete expected signature values that represent signature values from clocking all of the data contents from the respective scan chains into the MISR for each of the test patterns. The expected signature memory 170 can also include intermediate expected signature values that represent signature values from clocking a portion of the data contents from the respective scan chains into the MISR for each of the test patterns. As noted previously, complete signature values are used during a per pattern testing phase for the integrated circuit whereas the intermediate signature values are used during subsequent per cycle testing to debug and analyze the actual root cause of failure for the integrated circuit.

A logging system 174 (e.g., host processor from ATPG) can log the failure condition at the output of the comparator 150 as a failed test pattern in memory as a log file 180. The logging system 174 can be executed as part of an automatic test-pattern generator (ATPG) and/or in accordance with operations of the processor 160 which can also be part of the ATPG (e.g., the comparator 150 can provide the results of the comparison to the processor 160 or directly to memory accessible by the processor). If any failed patterns are detected, the processor 160 during a subsequent per cycle/debug phase of the integrated circuit provides the failed test pattern from the log file 180 to the ATPG to enable the scanned chains to be loaded in response to the failed test pattern. During this debug phase, the processor operates the interface 140 to clock an individual data bit out of each of the scan chains into the MISR 110 and loads the shift register 130 with the contents of the MISR. The contents of the shift register 130 represent an intermediate signature derived from the MISR and a portion of the scan chains in response to the clock. The processor 160 then operates the interface 140 to read the contents from the shift register 130 representing the intermediate signature. The intermediate signature is compared to an expected intermediate signature value from the expected signature memory 170 to determine circuit faults within the integrated circuits based on the comparison.

As noted above, at least two test phases can be executed by the system 100 that includes initial per pattern testing with the MISR 110 and shift register 130 and subsequent per cycle testing where the roles of the MISR and shift register are changed to facilitate granular debug analysis of individual circuit elements. With respect to per pattern testing, as each pattern is shifted out of the scan chains into the MISR 110, the expected signature for that pattern is also shifted into the shift register 130 via serial and clock pins of the interface 140, where the number of clock pulses is equal to the length of the complete signature. For example, if the maximum size of the scan chains is 100 bits, 100 clocks would be used to cycle 100 bits from each of the scan chains into the MISR 110 to generate the complete signature.

After the complete shift-out of each pattern, the cumulated MISR signature is compared with the expected signature where the comparator 150 compares the values in MISR 110 and the shift register 130, using a bit-wise comparison. A single bit Fail/Pass status can be strobed at the output of the comparator 150 depending on the results of the comparison. In the event of no failure (e.g., the MISR test pattern matches the expected signature), the same per pattern test process repeats until the testing is completed, such as by analyzing the results of the input set of test patterns have. In the event of a failure, the expected signature is loaded onto the MISR 110 from the shift register 130 using interface signals from the interface 140 (e.g., via multiplexers shown in FIG. 3). This loading between MISR 110 and shift register 130 facilitates continue-on-fail testing by the system by not allowing the subsequent MISR signature in the test sequence to be corrupted due to a previous failing pattern in the MISR. If it is desired to strobe out the final signature from the MISR 110, the interface 140 can generate corresponding interface signals to trigger capture of the values of the MISR 110 into the shift register 130, which can then be shifted out of the shift register via the interface clocking the data out as a serial stream into corresponding memory.

After per pattern testing is complete and if any failures were detected, subsequent per cycle testing can commence using the contents of the log file 180 to initiate debug and analytical procedures for the integrated circuit. With respect to the failing test pattern, portions of the test pattern (e.g., intermediate signatures) from the failing cycle are used to identify the failing flip-flops in the integrated circuit. As used herein, the term cycle refers to clocking a portion (e.g., a bit) of the contents of the scan chains into the MISR via at least one clock pulse such that individual circuit operations can be observed and diagnosed (e.g., by a user or debug system) to determine failure. For enabling per cycle signature analysis (e.g., for diagnosis and debugging of the IC), the failing test pattern can be shifted from the scan chains into the MISR 110 and is followed by a capture pulse. After the capture pulse, the MISR 110 is reset by pulsing a reset pulse from the interface 140. One pulse each of a SCAN_CLOCK to shift content from the scan chains and MISR_CLOCK is given after the MISR reset to load the last values on from the scan chains to the MISR 110, which in turn are captured onto the shift register 130 using interface capture signals.

The values in the shift register 130 can then be shifted out via serial lines in response to clock pulses from the interface, with the number of clock pulses being equal to the MISR signature length. This can be performed for each of the cycles (e.g., maximum number of bits per scan chain) in the failing test pattern. Also, since there can be failures in multiple cycles in a given failing pattern, the MISR can be reset by pulsing reset from the interface 140 each time before a shift-out so that the previously failing cycles do not affect the subsequent cycle and the failing cycles can be identified independently. The strobed per cycle MISR signatures for the failing patterns can then be compared against the expected per cycle MISR signatures (e.g., intermediate signatures described above) to identify the failing cycles and the failing bits of the MISR in those cycles. This failing bits information reveals the failing scan chain, and the combination of the failing cycle and the failing scan chain can be used (e.g., by the processor 160 or other diagnostic tools) to identify the failing circuit component (e.g., flip flop) in the integrated circuit.

Figure 2:
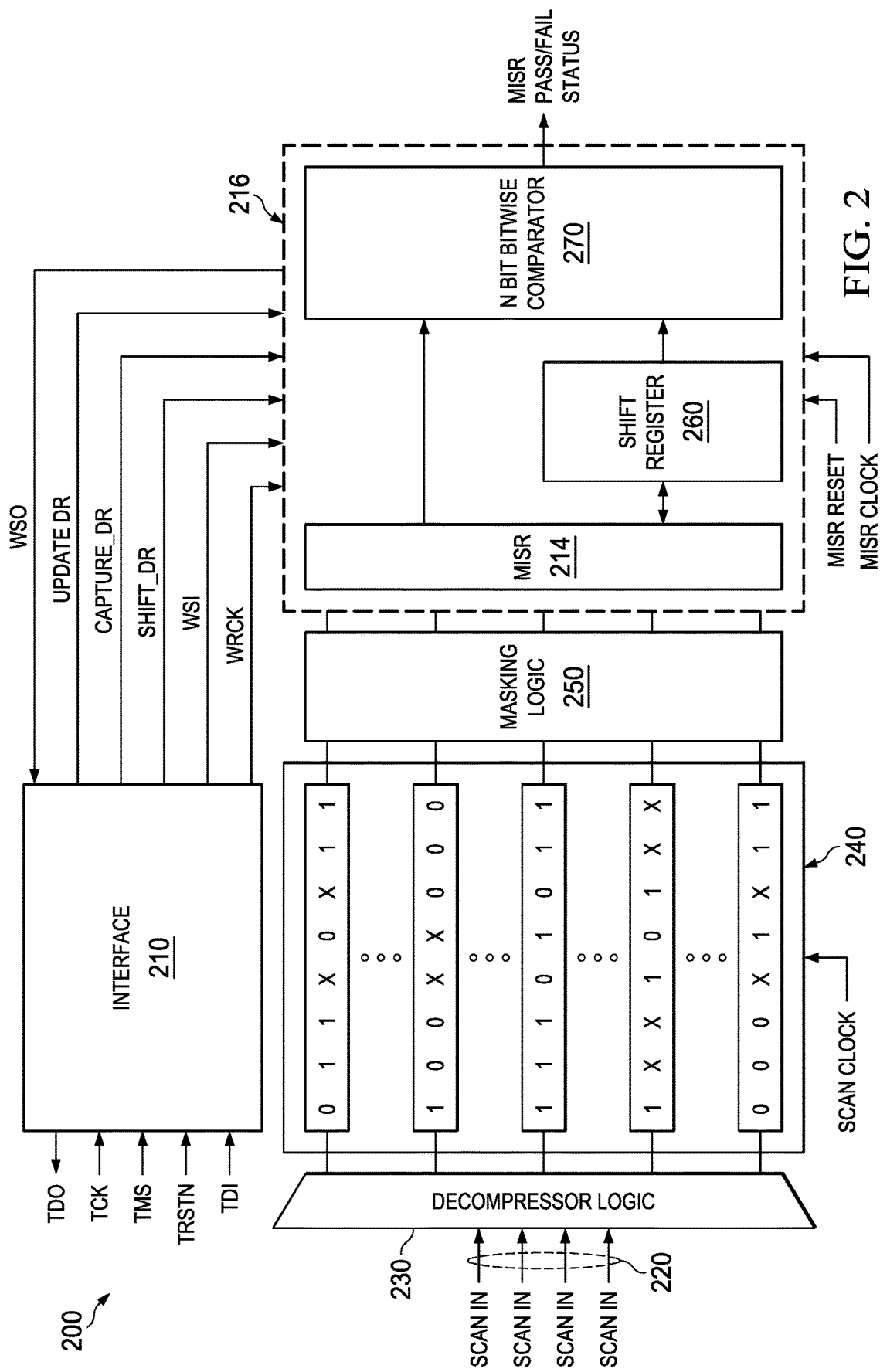
FIG. 2 illustrates an example circuit diagram of a testing system and interface that utilizes a multiple input signature register (MISR).

FIG. 2 illustrates an example of a testing system 200 and interface 210 that utilizes a multiple input signature register (MISR) 214. The interface 210 can communicate MISR-side signals with register circuitry 216. The MISR-side signals, including a MISR_RESET to reset the MISR, a MISR clock to clock data to/from the MISR, an UPDATE_DR which transfers the contents of the shift register to the MISR, CAPTURE_DR which transfers the contents of the MISR to the shift register, a WRCK which represents clocks employed by the interfaces described herein, a SHIFT_DR which shifts an expected signature from the interface 140 into the shift register, a WSI which represents a serial input stream to the shift register, and a WSO which represents a serial output from the shift register to the interface. On the processor side of the interface 210, signals are communicated between the processor (e.g., processor 160 of FIG. 1) and the interface 210. These processor-side signals can include serial data input and outputs TDI and TDO, a clock TCK, a reset TRSTN, and test signal TMS.

A test pattern can be input at 220 to a decompressor 230 which indirectly feeds a plurality of scan chains 240 in this example. As noted previously, M such scan chains can be supported. Each of the scan chain 240 holds a logic 1, logic 0, or a don't care state "X" which represents testing status from an integrated circuit that has been exercised based on the test pattern 220. To account for the don't care state X and proper operation of the MISR 214, masking logic 250 can be provided to process and the scan chains such that the known states and the don't care states are presented suitably to the MISR 214. As shown, a shift register 260 can be provided to facilitate testing operations with the MISR 214 as described herein. A comparator 270 is provided to compare expected signatures from the expected signature file, as described herein, with actual signatures clocked into the MISR 214 from the scan chains 240.

Figure 3:
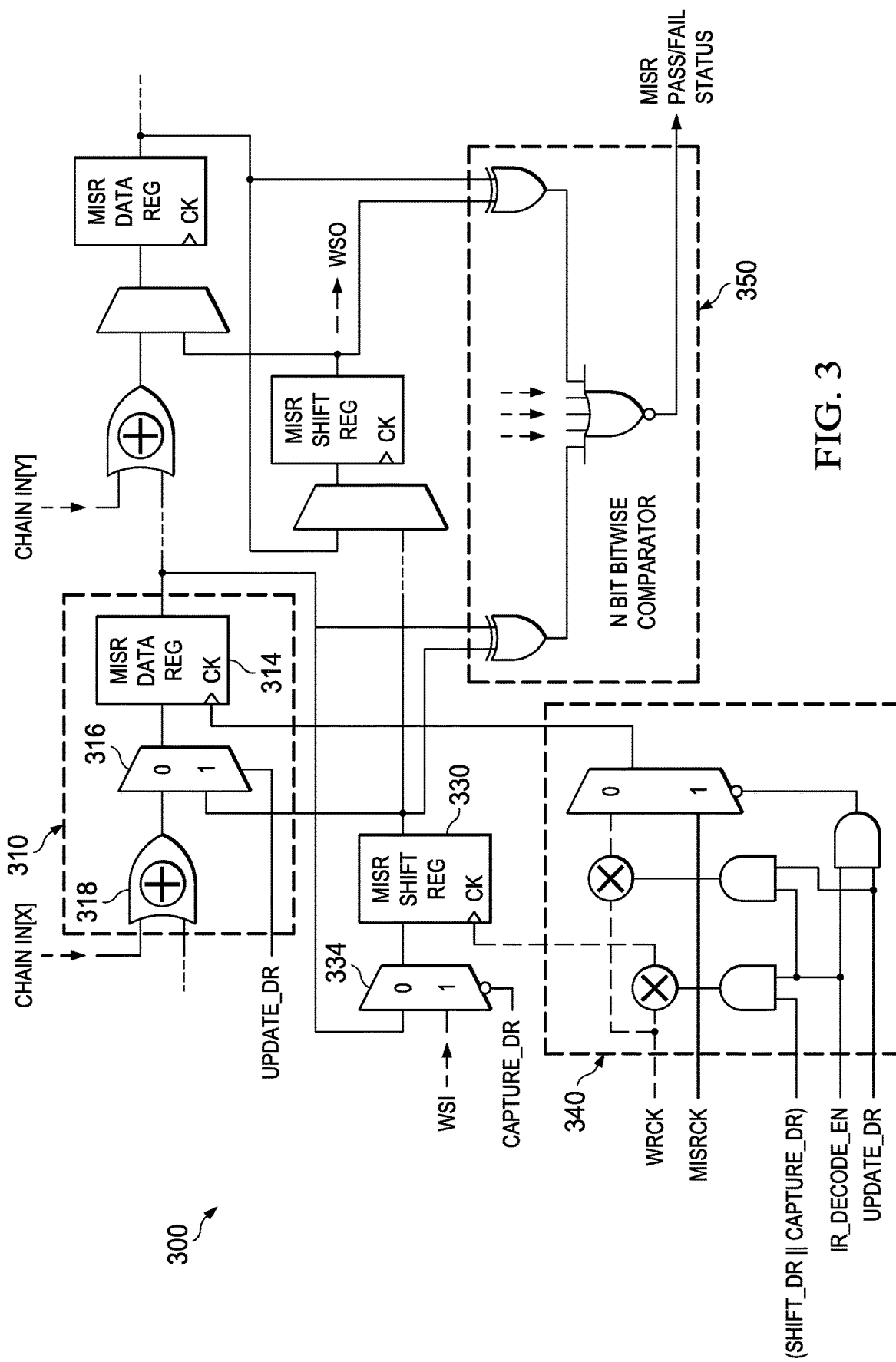
FIG. 3 illustrates an example of a multiplexing circuit for providing comparisons between a multiple input signature register (MISR) and a shift register that holds a comparison value for the MISR.

FIG. 3 illustrates an example circuit 300 demonstrating the logic and interactions between the MISR 214, the shift register 260, and the comparator 270 in FIG. 2. The circuit 300 is configured to perform comparisons between a MISR and a shift register that holds an expected signature comparison value for the MISR. The circuit 300 includes one or more MISR cells 310 to generate a signature from scan chain data as described herein. For example, each cell 310 can include a flip flop 314 which is fed from a multiplexer 316, which in turn is driven at one input via an exclusive OR logic 318 to facilitate generation of the signature. The multiplexer 316 is utilized to feed one of a signature scan chain to the flip flop 314 or to allow contents of a shift register such as shown at 330 to be clocked into the flip flop 314. The shift register 330 can be loaded via the output of the MISR cells or from serial input WSI via multiplexer 334. Signal UPDATE_DR and CAPTURE_DR signals control the action of the multiplexers 316 and 334, respectively. For purposes of brevity, other cells shown in the diagram 300 are not similarly described, but operate similarly as explained with respect to cell 310.

The circuit 300 can also include a clocking circuit 340 to clock the respective MISR data register 314 and shift register 330. The clocking circuit 340 can be driven via signals that are further described with respect to timing FIGS. 4 and 5 below. These signals include WRCK, MISRCK, SHIFT_DR, and CAPTURE_DR, for example. The clocking circuit shown at 340 can be used for the operation of the registers 314 and 330. The MISR clock is multiplexed with the clock gated version of WRCK/TCK and the output of the multiplexer feeds the clock of the MISR. This clock gate is enabled when instruction register of the shift register is selected and JTAG state machine is in the Update-DR state, thus enabling the loading of the MISR through the shift register. The clock of the shift register originates from a clock gated version of WRCK/TCK, and this clock gate is enabled when the instruction register of the shift register is selected and the JTAG state machine is either in the Shift-DR or Capture-DR state, thus enabling the shift-in and shift-out of MISR signatures on the shift register through WSI/TDI pins and also, the capture of the values in the MISR data register onto the shift register.

As shown in the example of FIG. 3, a multiplexer 316 can be included at the input of all the flip flops of the MISR 314, where the 'a' path of the multiplexer comes from the scan chains, while its 'b' path is connected to the output of the corresponding flops in the shift register 330. The select line of these multiplexers 316 can be controlled by the Update-DR state of the JTAG (or IEEE 1500) state machine. In this manner, when the MISR register is selected using its state machine instruction register and the state machine is in Update-DR state, the values of the shift register can be loaded onto the MISR.

A similar multiplexer architecture is also present for controlling inputs to the shift register 330. For instance, the 'a' path of this multiplexer 334 comes from Wrapper Serial Input (WSI)/Test Data Input (TDI), which works on Wrapper Clock (WRCK) or Test Clock (TCK) depending on whether 1500 or JTAG interface is being used. The 'b' path of this multiplexer 334 is connected to the output of the corresponding flops in the MISR data register 314. The select line of these multiplexers is controlled by the Capture-DR state of the JTAG state machine. Thus, for example, when the shift register is selected using its instruction register and the state machine is in Capture-DR state, the values of the MISR data register 314 can be captured into the shift register 330.

The circuit 300 also includes an N-bit bitwise comparator 350, such as corresponding to comparators 150 and 270. The comparator 350 can compare the values in shift register containing the expected MISR signature and the MISR containing the calculated MISR signature, and provides a single bit pass/fail status condition for each pattern which can be logged out on a test pin, thus enabling per pattern signature comparison.

As disclosed herein, the circuit 300 enables per pattern and per cycle signature analysis with little test-time and test-volume impact. This includes enabling per cycle signature observation to identify failing flip-flops. This does not require additional long-chain diagnostic test-mode as with current test schemes. Existing Test Data Output (TDO)/Wrapper Serial Output (WSO) pins can be used for MISR observe operations avoiding the need for an exclusive test-pin.

The example circuit 300 also enables continue-on-fail in the event of failures. The internal bit-wise comparator 350 mitigates the need for strobing out the entire signature. A complete dictionary of per pattern and per cycle signature information (e.g., expected signature memory/file) can be generated using custom scripts, for example.

Figure 4:
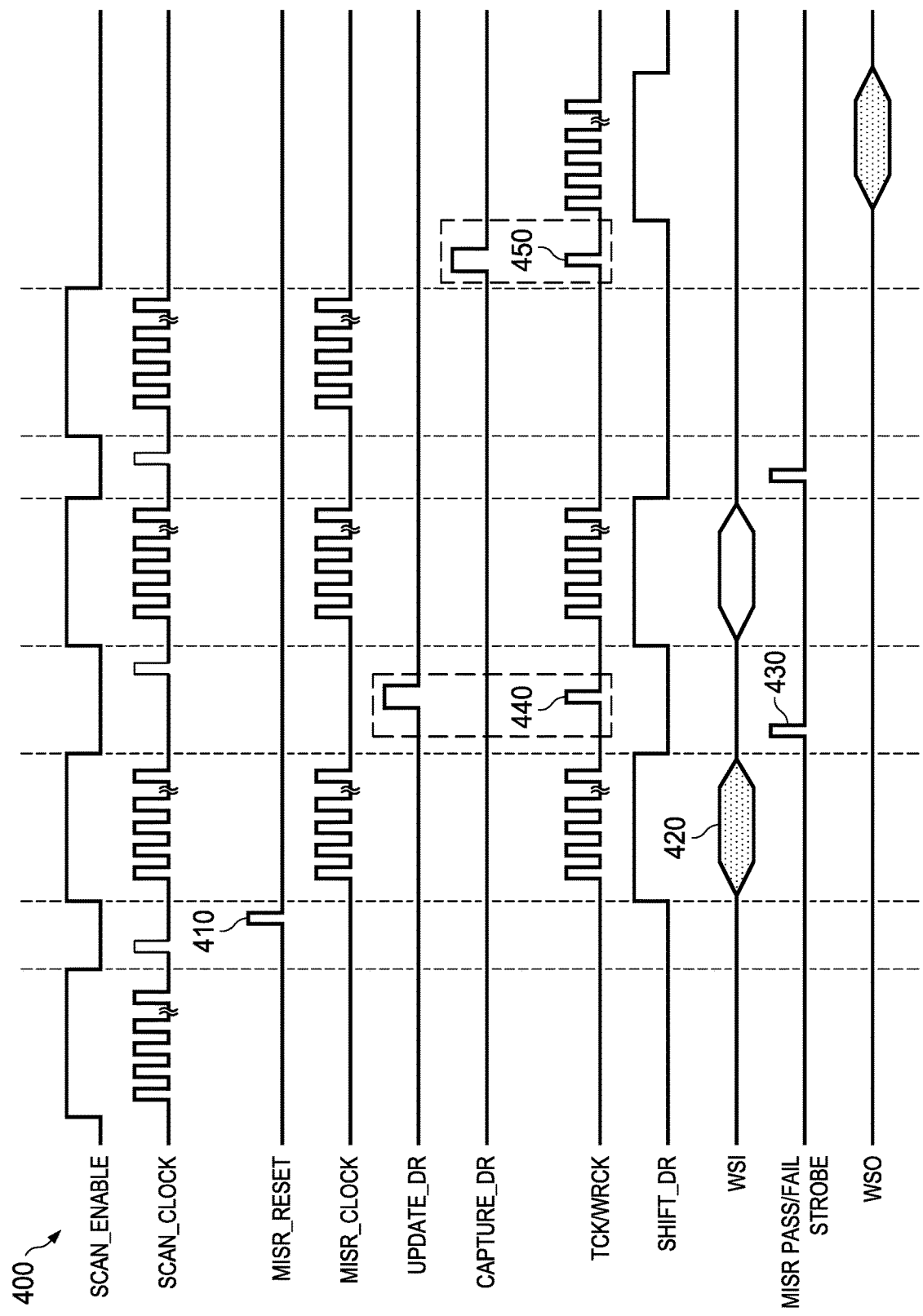
FIG. 4 illustrates and example timing diagram for per pattern testing in accordance with a multiple input signature register (MISR).

FIG. 4 illustrates an example timing diagram 400 for per pattern testing using a MISR as disclosed herein. On the left of the diagram 400, various interface signals (e.g., including signals demonstrated in FIGS. 2 and 3) are shown. The interface signals, for example, can include a scan clock to clock data out of the scan chains, a MISR_RESET to reset the MISR, a MISR clock to clock data to/from the MISR, an UPDATE_DR which allows the contents of the shift register to be transferred to the MISR, CAPTURE_DR which allows the contents of the MISR to the shift register, TCK/WRCK which represents clocks employed by the interfaces described herein, a SHIFT_DR which allows an expected signature to be serially shifted into the shift register, a WSI which represents a serial input stream to the shift register, MISR PASS/FAIL strobe that is set when a failure is detected, and a WSO which represents a serial output from the shift register.

With respect to per pattern testing as described herein, at 410 of the diagram 400, a MISR Reset pulse is generated prior to the shift-out of the first pattern. At 420, shift into the shift register the expected signature for the first pattern. At 430, strobe the MISR pass/fail status computed by bitwise the comparator is demonstrated. At 440, the correct signature is loaded on to MISR data register in the event of failure to continue on fail. At 450, the final MISR signature is captured on the shift-register and strobe is applied to shift out through the WSO.

Figure 5:
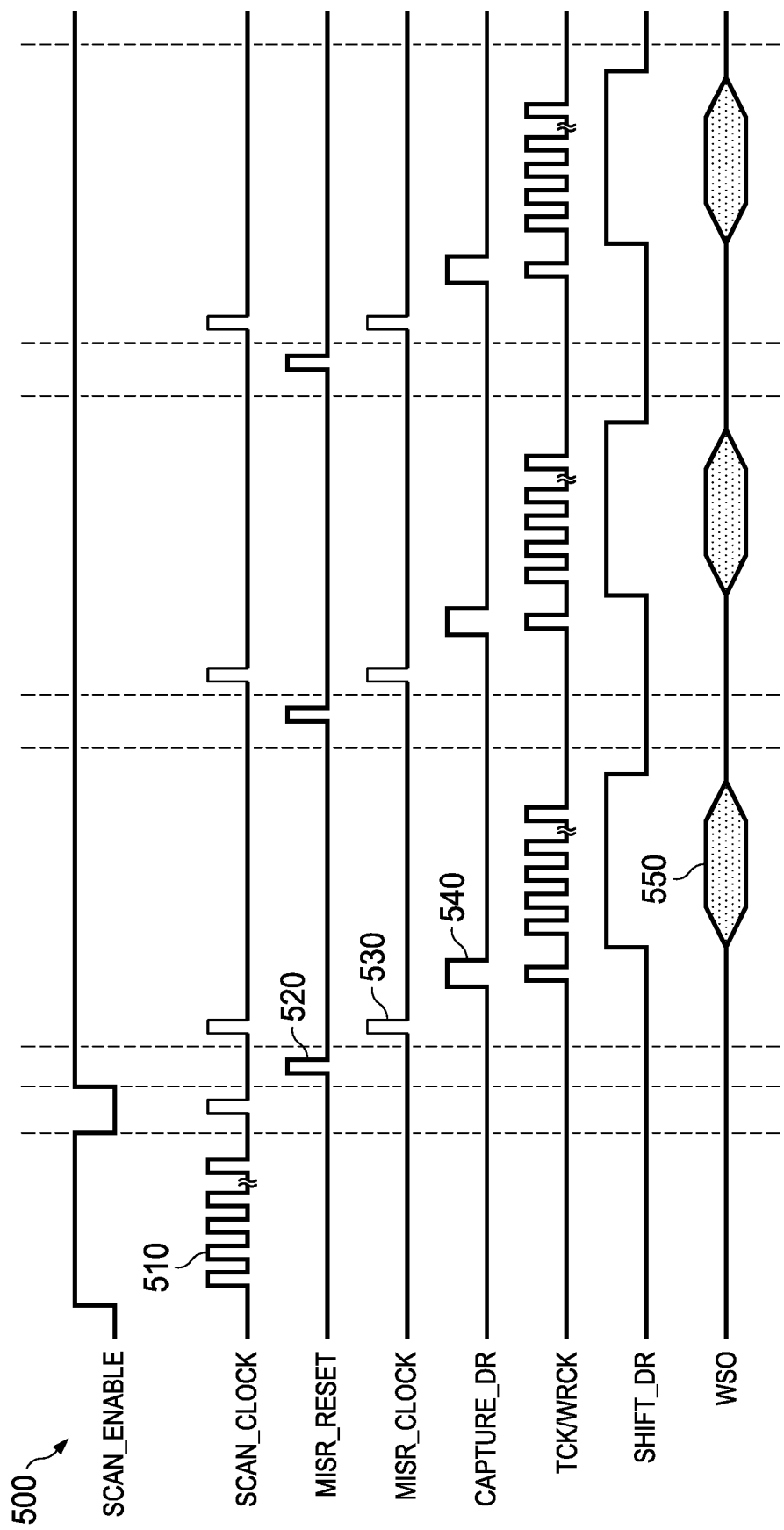
FIG. 5 illustrates and example timing diagram for per cycle testing in accordance with a multiple input signature register (MISR).

FIG. 5 illustrates an example timing diagram 500 for per cycle testing using a MISR as disclosed herein. A subset of the same signals described above with respect to FIG. 4 are shown in the diagram 500 and reference may be made to the description of FIG. 4 for additional information about such signals. At 510, a Shift-In Sequence of the failing pattern into the scan chains is shown. At 520, the MISR is reset prior to first shift-out pulse from the scan chains. At 530, a single pulse is applied on shift and MISR clocks to load the last value on the scan chain to the MISR. At 540, capture the MISR signature on the shift register. At 550, the per cycle MISR signature is shifted out through serial output WSO and it is compared against expected intermediate signature value.

Figure 6:
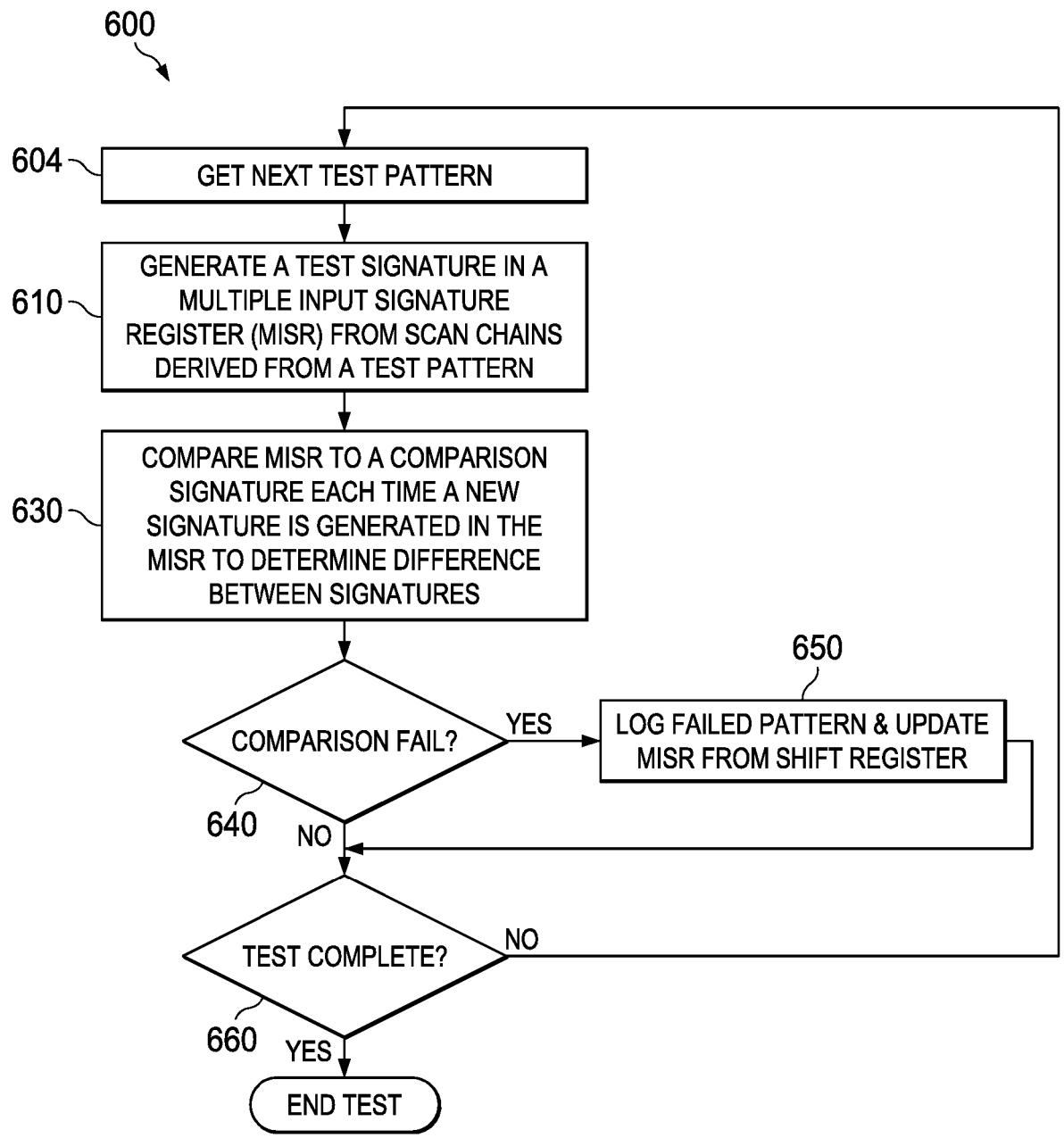
FIG. 6 illustrates and example method for per pattern testing in accordance with a multiple input signature register (MISR).
Figure 7:
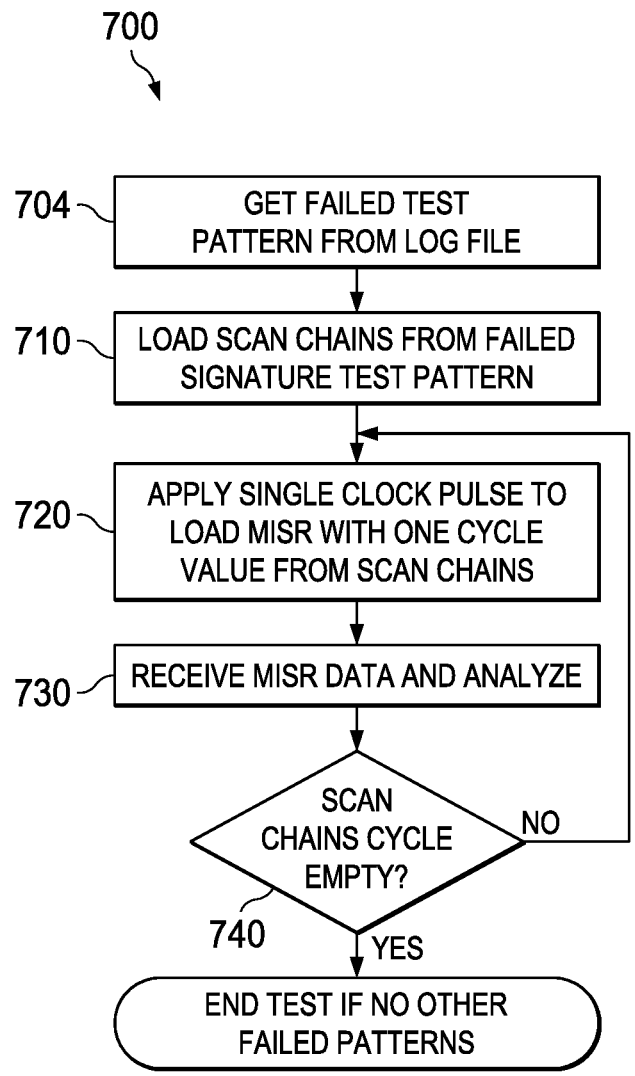
FIG. 7 illustrates and example method for per cycle testing in accordance with a multiple input signature register (MISR).

In view of the foregoing structural and functional features described above, example methods will be better appreciated with reference to FIGS. 6 and 7. While, for purposes of simplicity of explanation, the methods are shown and described as executing serially, it is to be understood and appreciated that the methods are not limited by the illustrated order, as parts of the methods could occur in different orders and/or concurrently from that shown and described herein. Such methods can be executed by various components configured in an integrated circuit, processor, or a controller, for example.

FIG. 6 illustrates and example method 600 for per pattern testing in accordance with a multiple input signature register (MISR). At 604, the method 600 retrieves a test pattern for testing (e.g., via ATPG described previously). At 610, the method 600 includes generating a test signature in a multiple input signature register (MISR) from scan chains derived from the test pattern applied to test an integrated circuit (e.g., via MISR 110 of FIG. 1).

At 630, the method includes comparing the test signature from the MISR to the comparison signature to determine a difference between the signatures (e.g., via comparator 140 of FIG. 1). As noted previously, the MISR can be clocked and compared externally to a comparison signature or can be compared with an on-board shift register that holds the comparison signature. At 640, if the comparison at 630 shows that the signatures are different, the method 600 proceeds to 650 and logs the failed pattern and updates the MISR from the shift register so that subsequent testing is not affected by the failed pattern. At 660, the method proceeds to determine if the test is complete, if so, the test ends, if not, the method proceeds back to 604 to retrieve another test pattern. If the comparison at 640 did not fail, the method also proceeds to 660 to determine if testing should proceed.

As noted previously, after the per pattern method 600 has executed, a per cycle debug analysis of the integrated circuit can be executed (see e.g., method of FIG. 7 below) after at least one test pattern has been stored in the log file. This can include loading scan chains derived from a test pattern retrieved from the log file that is related to a failed signature from a previous test of the integrated circuit and updating each register of the MISR by clocking at least one bit from each of the respective scan chains into each register of the MISR. The method can include moving the data from the signature register to the shift register after the updating of the MISR. This can include comparing the data from the shift register to a comparison data structure from an expected signature file to determine a circuit failure within the integrated circuit.

FIG. 7 illustrates and example method 700 for per cycle testing in accordance with a multiple input signature register (MISR). At 704, the method 700 retrieves a failed test pattern from a log file (e.g., via processor 160 of FIG. 1). At 710, the method 700 includes loading scan chains derived from a test pattern applied to test an integrated circuit (e.g., via ATPG described above). The test pattern can be retrieved from a log file that is related to a failed signature from a previous test of the integrated circuit. At 720, the method 700 includes updating each cell of a multiple input signature register (MISR) by clocking at least one bit from each of the respective scan chains into each cell of the MISR (e.g., via interface 140 of FIG. 1).

At 730, the contents of the MISR can be shifted out (e.g., via a shift register or from the MISR directly for external comparison) and compared to intermediate expected signatures from the expected signature memory. This can include comparing the data from the MISR to a comparison data structure (intermediate expected signature) in the log file to determine a circuit failure within the integrated circuit. At 740, a decision is made as to whether or not the scan chains have been emptied with respect to a given failed pattern under test. If so, the test ends unless there are other patterns to analyze whereby the method 700 could be repeated for the next pattern. If the scan chains have not been emptied at 740, the method 700 proceeds back to 720 where further per cycle testing of a given failed pattern can commence.

As noted previously, the generating of the log file can include generating a test signature in the MISR from scan chains derived from a test pattern applied to test the integrated circuit. This can include loading the shift register with a comparison signature from the expected signature memory that correlates the comparison signature to the test signature. The generation of the log file can also include comparing the test signature from the MISR to the comparison signature from the shift register to determine a difference between the signatures. This can include storing the test pattern in the log file if the comparison between the signatures is determined to be different to enable debug analysis of the integrated circuit.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. Additionally, where the disclosure or claims recite "a," "an," "a first," or "another" element, or the equivalent thereof, it should be interpreted to include one or more than one such element, neither requiring nor excluding two or more such elements.

What is claimed is:

1. A method, comprising:
   generating a test signature in a multiple input signature register (MISR) based on received scan chains, the received scan chains derived from a test pattern applied to test an integrated circuit;
   loading a shift register with a comparison signature from an expected signature memory;
   comparing the test signature from the MISR to the comparison signature each time a new signature is generated in the MISR to determine whether a difference between the signatures is present; and
   responsive to determining that a difference is present:
      storing the test pattern in a log file; and
      updating the MISR with the contents of the shift register.

2. The method of claim 1, further comprising, after the updating step:
   generating a subsequent test signature in the MISR from scan chains derived from a subsequent test pattern applied to test the integrated circuit;
   loading the shift register with a subsequent comparison signature from the expected signature memory;
   comparing the subsequent test signature from the MISR to the subsequent comparison signature from the shift register to determine whether a difference between the signatures is present; and
   responsive to determining that a difference is present, storing the subsequent test pattern in the log file.

3. The method of claim 2, further comprising executing a per cycle analysis of the integrated circuit after at least one test pattern has been stored in the log file, wherein the per cycle analysis relates to clocking the MISR at least one time and comparing the output of the MISR with respect to the shift register.

4. The method of claim 3, wherein the per cycle analysis further comprises loading scan chains derived from a test pattern retrieved from the log file that is related to a failed signature from a previous test of the integrated circuit.

5. The method of claim 4, further comprising updating each cell of the MISR by clocking at least one bit from each of the respective scan chains into the MISR.

6. The method of claim 5, further comprising moving the data from the signature register to the shift register after the updating of the MISR.

7. The method of claim 6, further comprising comparing the data from the shift register to a comparison data structure from an expected signature memory to determine a circuit failure within the integrated circuit.

\* \* \* \* \*